US012672371B2

(12) United States Patent
Lu et al.

(10) Patent No.: US 12,672,371 B2
(45) Date of Patent: Jun. 30, 2026

(54) SPAD PIXEL CIRCUITS AND METHODS THEREOF FOR DIRECT TIME OF FLIGHT SENSORS

(71) Applicant: Adaps Photonics Inc., San Jose, CA (US)

(72) Inventors: Ching-Ying Lu, San Jose, CA (US); Yangsen Kang, San Jose, CA (US); Shuang Li, San Jose, CA (US); Kai Zang, San Jose, CA (US)

(73) Assignee: Adaps Photonics Inc., San Jose, CA (US)

( * ) Notice: Subject to any disclaimer, the term of this patent is extended or adjusted under 35 U.S.C. 154(b) by 263 days.

(21) Appl. No.: 17/207,490

(22) Filed: Mar. 19, 2021

(65) Prior Publication Data

US 2021/0296377 A1 Sep. 23, 2021

Related U.S. Application Data

(60) Provisional application No. 62/992,617, filed on Mar. 20, 2020.

(51) Int. Cl.
| | |
|---|---|
| *H10F 39/00* | (2025.01) |
| *G01J 1/44* | (2006.01) |
| *H10F 30/225* | (2025.01) |
| *H10F 39/12* | (2025.01) |
| *H10F 77/30* | (2025.01) |
| *H10F 77/70* | (2025.01) |

(52) U.S. Cl.
CPC ............ *H10F 39/8033* (2025.01); *G01J 1/44* (2013.01); *H10F 39/026* (2025.01); *H10F 39/199* (2025.01); *H10F 39/805* (2025.01);

*H10F 39/807* (2025.01); *G01J 2001/4466* (2013.01); *H10F 30/225* (2025.01); *H10F 77/306* (2025.01); *H10F 77/703* (2025.01)

(58) Field of Classification Search
CPC ............ H01L 27/1461; H01L 27/1462; H01L 27/1463; H01L 27/14632; H01L 27/1464; H01L 31/02161; H01L 31/02363; H01L 31/107; G01J 1/44; G01J 2001/4466
See application file for complete search history.

(56) References Cited

U.S. PATENT DOCUMENTS

| | | | |
|---|---|---|---|
| 9,461,032 B1 * | 10/2016 | Edwards | ............. H01L 29/7304 |
| 2012/0205731 A1 | 8/2012 | Henderson et al. | |
| 2013/0193546 A1 * | 8/2013 | Webster | ................. H10F 71/00 |
| | | | 257/438 |
| 2015/0054111 A1 * | 2/2015 | Niclass | ............... H01L 27/1446 |
| | | | 257/438 |

(Continued)

OTHER PUBLICATIONS

International Search Report and Written Opinion for PCT/US2021/023334, mailed Jul. 13, 2021.

*Primary Examiner* — Norman D Richards
*Assistant Examiner* — Sean Ayers Winters

(57) ABSTRACT

The present invention relates generally to sensing devices. In a specific embodiment, the present invention provides a SPAD pixel device that include a p-type material that partially encloses an n-type material. The junction between the p-type material and the n-type material is three dimensional and includes both a horizontal area and lateral areas. The SPAD pixel device also includes isolation structures that separate the SPAD pixel device from others. There are other embodiments as well.

20 Claims, 17 Drawing Sheets

(56)                        References Cited

U.S. PATENT DOCUMENTS

| | | | |
|---|---|---|---|
| 2017/0176184 A1 | 6/2017 | Lee et al. | |
| 2017/0229598 A1* | 8/2017 | Roehrer | H10F 30/225 |
| 2018/0019268 A1 | 1/2018 | Zhang et al. | |
| 2018/0102442 A1* | 4/2018 | Wang | H01L 31/02327 |
| 2018/0108799 A1* | 4/2018 | Stark | H01L 31/1804 |
| 2018/0195900 A1* | 7/2018 | Delic | H01L 31/107 |
| 2019/0006548 A1* | 1/2019 | Wei | H01L 31/1804 |
| 2019/0131478 A1* | 5/2019 | Wang | H01L 27/14634 |
| 2019/0181177 A1 | 6/2019 | Kobayashi et al. | |
| 2020/0020734 A1* | 1/2020 | Wang | H01L 27/14685 |
| 2020/0105958 A1* | 4/2020 | Sasago | G01S 7/4863 |

* cited by examiner

200

202B

207B

202C

201

203B

203C

202D

203C

204

208

209

205

202A

203A

207A

SPAD PIXEL CIRCUITS AND METHODS THEREOF FOR DIRECT TIME OF FLIGHT SENSORS

CROSS-REFERENCES TO RELATED APPLICATIONS

The present application claims priority to U.S. Provisional Patent Application No. 62/992,617, filed Mar. 20, 2020, entitled "SPAD PIXEL DESIGN FOR DIRECT TIME OF FLIGHT SENSOR", which is commonly owned and incorporated by reference herein for all purposes.

BACKGROUND OF THE INVENTION

The present invention relates generally to sensing devices.

Research and development in integrated microelectronics have continued to produce astounding progress with sensor devices. Many examples of photodiodes exist. For example, a photodiode is a p-n junction or PIN structure. When a photon of sufficient energy strikes the diode, it creates an electron-hole pair. This mechanism is also known as the inner photoelectric effect. If the absorption occurs in the junction's depletion region, or one diffusion length away from it, these carriers are swept from the junction by the built-in electric field of the depletion region. Thus, as holes move toward the anode (electrons move toward the cathode), a photocurrent is produced. The total current through the photodiode is the sum of the dark current (current that is generated in the absence of light) and the photocurrent, so the dark current must be minimized to maximize the sensitivity of the device.

Another example of a photodiode is called an "avalanche photodiode". The avalanche photodiodes are photodiodes with a structure optimized for operating with high reverse bias, approaching the reverse breakdown voltage. This allows each photo-generated carrier to be multiplied by avalanche breakdown, resulting in internal gain within the photodiode, which increases the effective sensitivity of the device. A type of photodiode—usually referred to as a single-photon avalanche diode (SPAD) device—has been gaining popularity and used in a variety of applications, such as LIDAR system that have become a mainstream component of consumer electronics, automobiles, and other applications.

From the above, it is seen that techniques for improving sensing devices are highly desired.

BRIEF SUMMARY OF THE INVENTION

The present invention relates generally to sensing devices. In a specific embodiment, the present invention provides a SPAD pixel device that includes a p-type material that partially encloses an n-type material. The junction between the p-type material and the n-type material is three-dimensional and includes both a horizontal area and lateral areas. The SPAD pixel device also includes isolation structures that separate the SPAD pixel device from others. There are other embodiments as well.

According to an embodiment, the present invention provides a backside-illuminated (BSI) single-photon avalanche diode (SPAD) sensor device, which includes a silicon material having a front side and a back side. The device also includes a first deep trench structure positioned within the silicon material. The device also includes a second deep trench structure positioned within the silicon material. The device also includes an aperture positioned on the back side and between the first deep trench structure and the second deep trench structure. The device also includes an n-type material having a first top region and a first bottom region, the first bottom region bordering the back side. The first top region may include a first sidewall and a second sidewall. The n-type material is characterized by a first width. The device also includes an n-type contact directly coupled to the n-type material and positioned within the first bottom region. The device also includes a p-type material having a second top region and a second bottom region, the second bottom region enclosing the first top region. The p-type material is characterized by a second width, which is greater than the first width. The device also includes a junction region configured at an interface between first top region and the second bottom region.

The device may include a first shallow trench structure interface the first deep trench structure and a second shallow trench structure interfacing the second deep trench structure. The device may include a first p-type contact interfacing the first shallow trench structure and a second p-type contact interfacing the second shallow trench structure.

The device may include a first p-type contact configured within the vicinity of the first shallow trench structure and the front side. The device may further include a second p-type contact configured within the vicinity of the second shallow trench structure and the front side.

The device may include a p+ region positioned within the vicinity of the front side. The device may include a plurality of light trapping structures configured within the vicinity of the back side. The device may include a plurality of light trapping structures configured within the vicinity of the front side. The junction region may include an avalanche region. The device first may include a first p-well structure partially enclosing the first deep trench structure and a second p-well structure partially enclosing the second deep trench structure. The silicon material may include an epitaxially grown silicon material. The device may include a passivate layer overlaying the aperture. The p-type material is characterized by a graduated doping profile. The device may include an n-well region partially overlaying the first bottom region of the n-type material.

According to another embodiment, the present invention provides a single-photon avalanche diode (SPAD) sensor device. The device includes a silicon material having a front side and a back side. The device also includes a first isolation structure positioned within the silicon material and bordering the back side. The device also includes a second isolation structure positioned within the silicon material and bordering the back side. The device also includes an n-type material having a first top region and a first bottom region, the first bottom region bordering the back side. The first top region may include a first sidewall and a second sidewall. The n-type material is characterized by a first width. The device also includes an n-type contact directly coupled to the n-type material and positioned within the first bottom region. The device also includes a p-type material having a second top region and a second bottom region. The second bottom region encloses the first top region. The p-type material is characterized by a second width, which is greater than the first width. The device also includes a junction region configured at an interface between the first top region and the second bottom region.

Implementations may include one or more of the following features. The device may include an aperture positioned on the back side and between the first isolation structure and the second isolation structure. The device may include a passivation layer overlaying the aperture and the first isolation structure. The first isolation structure may include a first deep trench structure and a first p-well structure, the first p-well structure partially enclosing the first deep trench structure. The second isolation structure may include a second deep trench structure and a second p-well structure, the second p-well structure partially enclosing the second deep trench structure. The device may include a first shallow trench structure interfacing the first p-well structure and a second shallow trench structure interfacing the second p-well structure.

According to yet another embodiment, the present invention provides a frontside illuminated (FSI) single-photon avalanche diode (SPAD) sensor. The device also includes a silicon material having a front side and a back side. The device also includes a first isolation structure positioned within the silicon material. The device also includes a second isolation structure positioned within the silicon material. The device also includes an aperture positioned on the front side and configured between the first isolation structure and the second isolation structure. The device also includes an n-type material having a first top region and a first bottom region, the first top region bordering the back side. The first bottom region may include a first sidewall and a second sidewall. The n-type material is characterized by a first width. The device also includes an n-type contact directly coupled to the n-type material and positioned within the first top region. The device also includes a p-type material having a second top region and a second bottom region. The second top region encloses the first bottom region. The p-type material is characterized by a second width, which is greater than the first width. The device also includes a junction region configured at an interface between the first top region and the second bottom region.

In various embodiments, the first isolation structure may include a p-well region.

Many benefits are achieved by way of the present invention over conventional techniques. For example, the present technique provides an easy-to-use process that relies upon conventional technology. In some embodiments, the method provides higher device yields in dies per wafer with the integrated approach. Additionally, the method provides a process and system that are compatible with conventional process technology without substantial modifications to conventional equipment and processes. Preferably, the invention provides for an improved CMOS integrated circuit device and related methods for a variety of uses. Depending upon the embodiment, one or more of these benefits may be achieved. These and other benefits will be described more throughout the present specification and more particularly below.

The present invention achieves these benefits and others in the context of known technology. However, a further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

DETAILED DESCRIPTION OF THE INVENTION

The present invention relates generally to sensing devices. In a specific embodiment, the present invention provides a SPAD pixel device that includes a p-type material that partially encloses an n-type material. The junction between the p-type material and the n-type material is three-dimensional and includes both a horizontal area and lateral areas. The SPAD pixel device also includes isolation structures that separate the SPAD pixel device from others. There are other embodiments as well.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

Figure 1A:
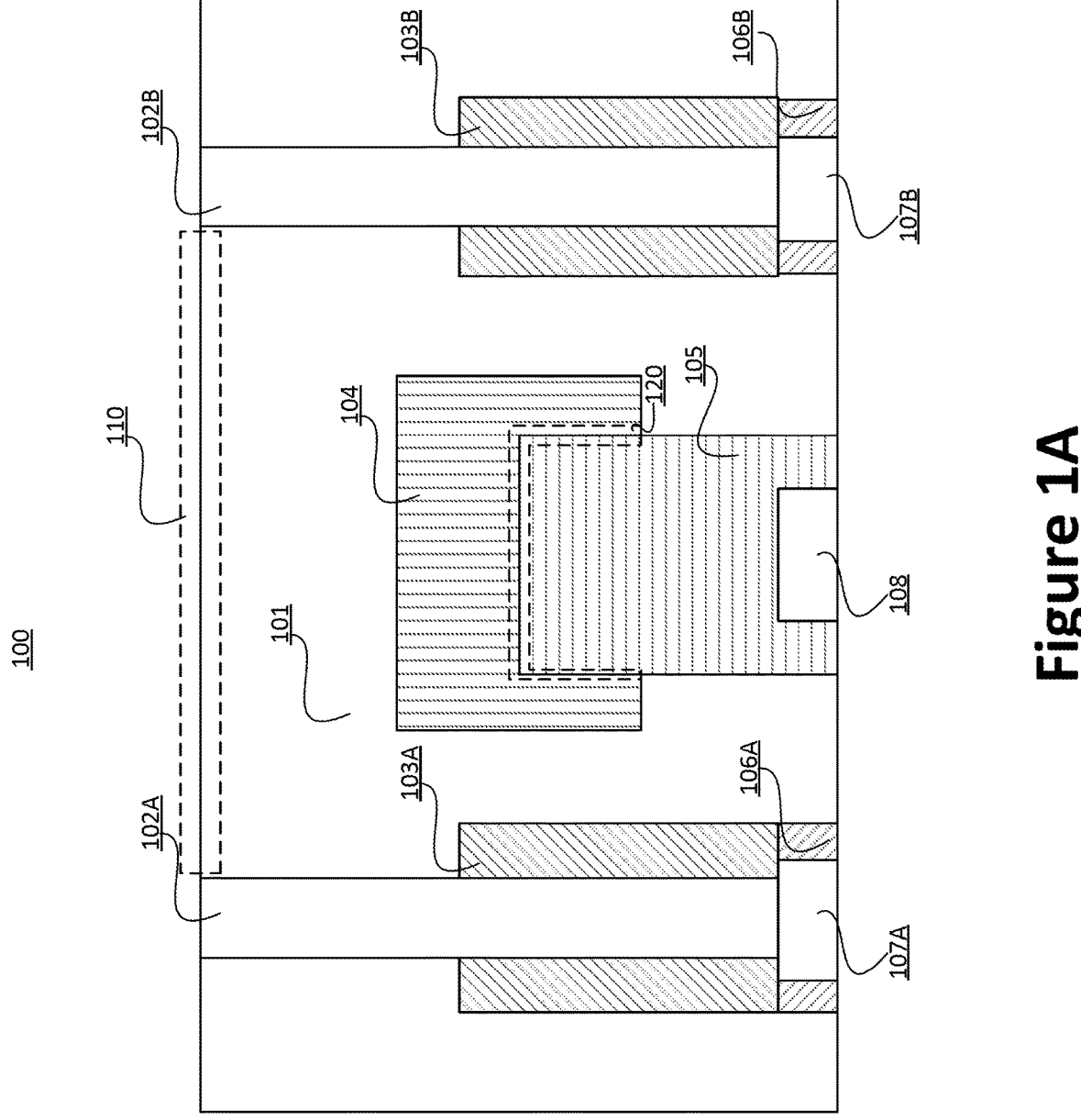
FIGS. 1A and 1B are simplified diagrams illustrating a BSI SPAD pixel device 100 according to embodiments of the present invention.
Figure 1B:
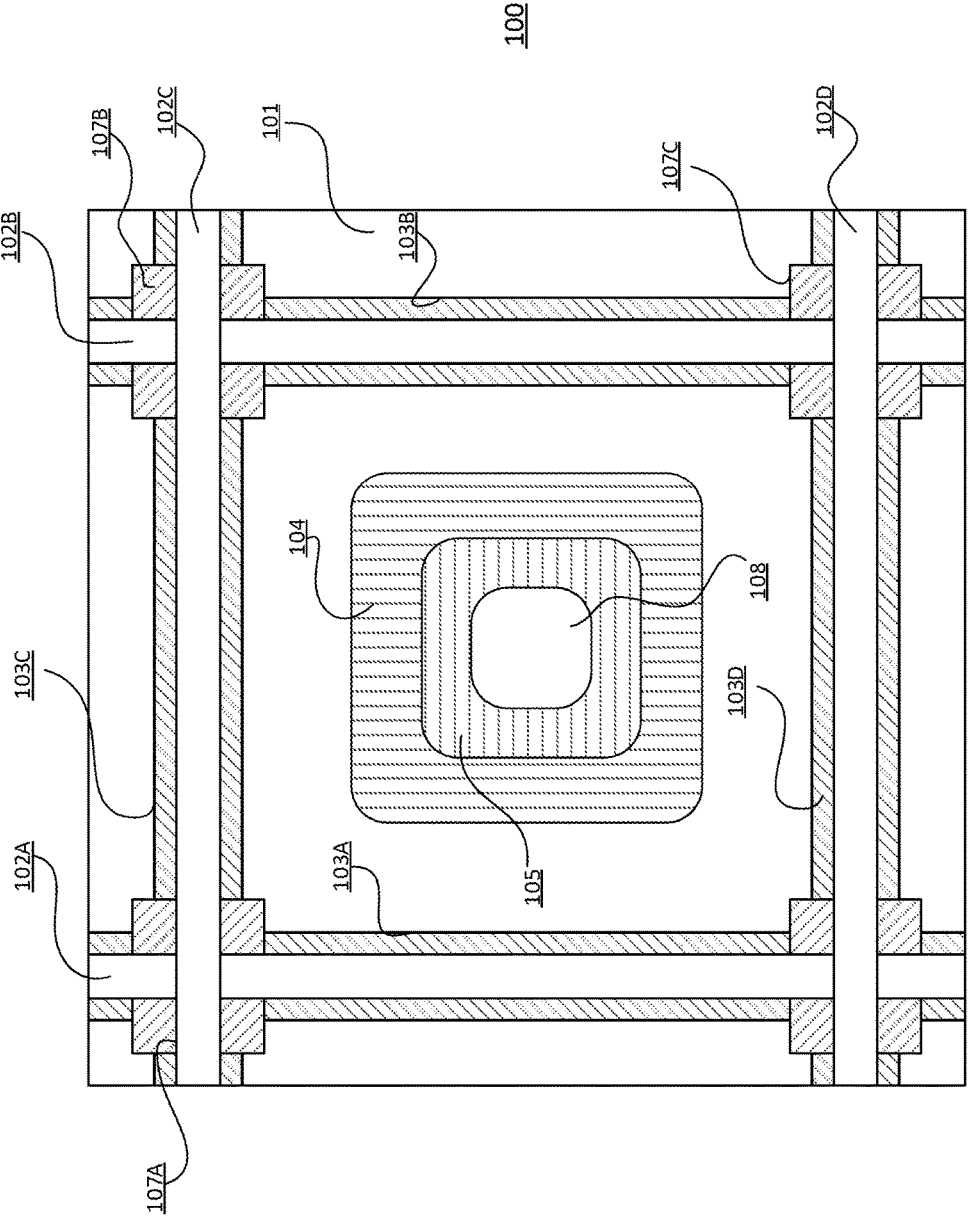

FIGS. 1A and 1B are simplified diagrams illustrating a BSI SPAD pixel device 100 according to embodiments of the present invention. These diagrams merely provide an example, which should not unduly limit the scope of the claims. One of ordinary skill in the art would recognize many variations, alternatives, and modifications. More specifically FIG. 1A is a cross-sectional view diagram and FIG. 1B is a bird-eye view diagram. In various embodiments, a BSI SPAD pixel device 100 is fabricated within silicon material 101. For example, silicon material 101 may be formed by an epitaxial growth process. As shown, a thickness of epitaxial material ranging from about 3 μm to about 12 μm is grown using a high-temperature growth technique, among others. In an example, the epitaxial growth is made using chemical vapor deposition (CVD) process. In various embodiments, SPAD pixel device 100 may be configured on a semiconductor substrate that includes wiring and circuits for interconnecting many SPAD pixel devices. For example, p-contacts (106A and 106B) and n-contact (108) are coupled to a circuit below (not shown). As an example, the substrate may be a complementary metal-oxide silicon (CMOS) substrate, a blank or unpatterned substrate, a patterned, hybrid substrate, among others. In an example, the semiconductor substrate has a plurality of CMOS cells for logic circuitry, and can also include a plurality of memory cells, interface cells, and other circuit elements. As shown, the substrate has a bonding region and logic circuits, which can be configured as an output, quenching, recharge circuit, among others. Of course, there can be other variations, modifications, and alternatives.

As an example, in FIG. 1A, the top side of the silicon material is referred to as "the back side" and the bottom side of the silicon material is referred to as "the front side". The terms "front" and "back" refer to the front and back sides of a semiconductor wafer during the manufacturing process, during which various processes are performed on the front side of the wafer. A BSI SPAD refers to the side that light (e.g., photons) enters the SPAD device. An aperture region 110 is located on the back side of SPAD device 100. As described below, microlens or other types of optical structures (e.g., nanostructure, antireflection coating, color filter, bandpass filter, etc.) may be configured on the aperture region 110 of the BSI SPAD pixel device 100, and these optical structures help guide incoming light and signal photons to the target region, which is the junction between the n-type material 105 and p-type material 104. The passivation layer (not shown) may be configured around the aperture region. In an example, a passivation layer may include an oxide material, a high-K dielectric material (e.g., Al2O3, HfO2, Ta2O5, etc.), a nitride material (Si3N4, SiON, etc), or a polyimide material, combinations thereof, and the like.

The SPAD pixel device 100 is enclosed by isolation structures, which separate device 100 from neighboring SPAD pixels devices. In various embodiments, isolation structures comprise deep trench isolation (DTI) structures. For example, DIT structures 102A-D (shown in FIG. 1B) constitute the four "walls" that enclose SPAD pixel device 100. In an embodiment, the DTI structure comprises a fill material, a surrounding charge material, and a surrounding insulating material. In an example, the fill material comprises a metal material, a semiconductor material, or an insulating material. In a preferred example, the fill material is tungsten. In an example, the surrounding charge material is Al₂O₃. Depending on the implementation, other materials may be as well. In an example, the surrounding insulating material includes an oxide or a nitride material, among others. In an example, the surrounding insulating material is SiO₂

The isolation structures may additionally include p-well regions 103A-D. In various embodiments, p-well regions are characterized by a p-type diffusion of boron. Depending on the implementation, other types of material may be used for the p-type diffusion as well. For example, p-well regions may be formed by implantation by multiple energy over an epitaxial growth base, rather than a substrate. Depending on the implementation, the isolation structures—which look like four border walls of the pixel device 100—can be implemented with DTI structures and/or p-well regions. In FIG. 1A, DTI 102A and 102B extend from the top surface of silicon material 101 all the way to shallow trench isolation (STI) structures 107A and 107B, and p-well regions 103A and 103B bordering a lower portion of the DTI structures 102A and 102B. In certain embodiments (see FIG. 10 below), DTI structures only extend to a middle region of the silicon material, and p-well regions extend between the DTI structures and STI structures. In some implementations, isolation structures may include only p-well regions and no DTI structures. In various embodiments, p-well regions 103A and 103B may be formed by an implantation process, which may use multiple energies from a few hundred keV to a few MeV. The p-well regions could be through the entire epi thickness to provide passivation and isolation.

Shallow trench isolation structures 107A and 107B are configured below the deep trench isolation. In an example, shallow trench isolation can include an oxide material as a filler. Depending on the implementation, the width and other dimensions of STI structures 107A and 107B are configured relative to the location of n-type material 105. For example, STI structures are within the width (i.e., about the same width or narrower) relative to DTI structures. P-type contacts 106A and 106B (or sometimes referred to as "P+"

contacts) are configured at the bottom surface of silicon material 101. P-type contacts 106A and 106B are to be coupled to the metal contacts (e.g., copper, tungsten, etc.) of an electrical circuit (e.g., a pixel control circuit for reading the output signals of an SPAD pixel device). N-type contact 108 as shown is coupled to the n-type material 105. For example, n-type contact 108 and p-type contacts 106A and 106B may be configured using various types of implanted material (e.g., implanted silicon that is conductive).

The performance of a SPAD pixel device in large part is measured by its ability to collect—at the avalanche region 120 positioned between the p-type material 104 and n-type material 105—photon-generated carriers. For example, the avalanche region refers to a region that is within a certain proximity of the junction defined by the interface between the p-type material 104 and the n-type material 105. A large junction area translates large avalanche area for collecting photon-generated carriers, which translates to good performance. However, it is difficult to maintain the size of the junction, as the trend is to decrease the size of the SPAD pixel devices (e.g., going below 10 μm). It is thus to be appreciated that embodiments of the present invention provide a design that increases the size of the junction between the p-type material 104 and n-type material 105. For example, p-type material 104 as shown (may be referred to as "P-SPAD") includes a retrograde p-well. For example, the P-SPAD may be formed by implantation processes (e.g., with one or more implantation energy). The region of p-type material 104, as implemented in various embodiments, is associated with a non-uniform doping concentration profile. For example, the doping concentration is the greatest near the active junction region at which p-type material 104 interfaces with n-type material 105.

N-type material 105, as shown, may include a n-well. For example, n-type material 105 may be referred to as "N-SPAD". N-SPAD may be formed by an implantation process, which could use multiple implantation energy levels. An important aspect of n-type material 105 is its dimensions: n-type material 105 is narrower than p-type material 104 as shown. The junction between p-type material 104 and n-type material 105 includes both the horizontal interface and the vertical interface as shown in FIG. 1A. More specifically, the bottom surface of p-type material 104 interfaces with the top surface of n-type material 105. And because p-type material 104 is wider and encloses n-type material 105, the top sidewalls of n-type material 105 also interface with p-type material 104. Compared to conventional designs, the sidewall portions of the junction interfaces create a lateral electrical field and increase the total area for collecting the photon-generated carriers. Depending on the implementation, the dimensions of N-SPAD and P-SPAD may vary, but the width of P-SPAD is always greater than the width of N-SPAD, and P-SPAD includes a region that partially encloses the N-SPAD.

It is to be noted that N-SPAD 105 and P-SPAD 104, fabricated using implantation processes, both have non-uniform doping concentrations. For example, p-type material 104 is formed by a first implantation process, and the p-type material 104 is characterized by a radial concentration gradient around a center. In various embodiments, P-SPAD 104 is implanted at least 200 nm into the silicon from the front surface, which is to ensure that the avalanche region is away from the front surface and lower the undesirable dark count rate (DCR). That is, carriers generated from the defects at front surface would not travel to the avalanche region. In various embodiment, the P-SPAD 104 may have a concentration gradient from the avalanche region 120 toward the back surface. This creates a wider P-SPAD region and a higher electric field. This configuration shortens the carrier travel time from the epitaxial region 101 to the avalanche region 120 and makes the jitter smaller. For example, the concentration gradient in P-SPAD 104 may be generated by post-implantation anneal; the concentration gradient may also be generated by using multiple energies in implantation.

In various embodiments, the n-material 105 is also formed by a second implantation process, and certain n-type dopants are implanted into a portion of p-type material. The n-type implantation is at least 1 μm away from the p-well regions 103A and 103B to avoid direct carrier path from p-well regions 103A and 103B to the n-type contact 108 without passing through the avalanche region. The placement of the n-type material 105 is also to avoid the avalanche region 120 extending from the desired junction area to the front surface.

For example, the implanted p-type material comprises a boron material having a concentration density of 1E15 atoms/cm$^3$ to 1E18 atoms/cm3. For example, the implanted n-type material comprises a phosphorous entity or an arsenic entity having a concentration density of 1E17 atoms/cm3 to 1E19 atoms/cm3. Of course, there can be other variations, modifications, and alternatives. As shown, the implanted p-type material and the implanted n-type material are configured within a vicinity of the semiconductor substrate of the pixel element or near the bonding region.

Figure 1C:
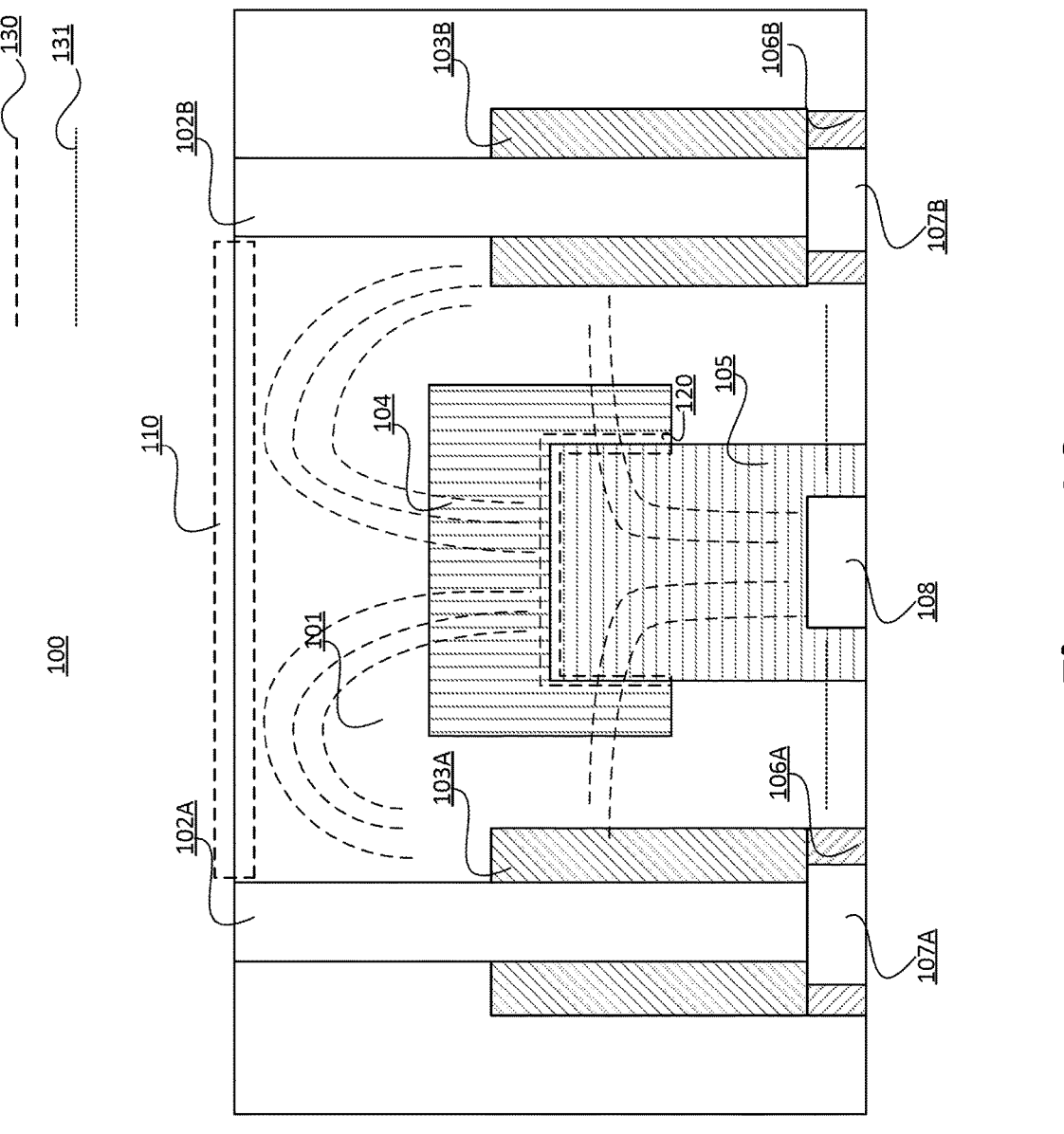
FIG. 1C is a simplified diagram illustrating the operation of an exemplary SPAD pixel device.

FIG. 1C is a simplified diagram illustrating the operation of an exemplary SPAD pixel device. This diagram is merely an example, which should not unduly limit the scope of the claims. One of ordinary skill in the art would recognize many variations, alternatives, and modifications. As shown, photon-generated carriers travel through path 130 (indicated with the dash line pattern) to avalanche region 120. Carriers that are generated by defects at front surface travel along path 131 (indicated by the dotted line pattern), and they do not reach avalanche region 120. It is to be appreciated the lateral region of the avalanche region 120 can significantly improve photon/carrier detection, without picking up undesirable carriers.

Figure 1D:
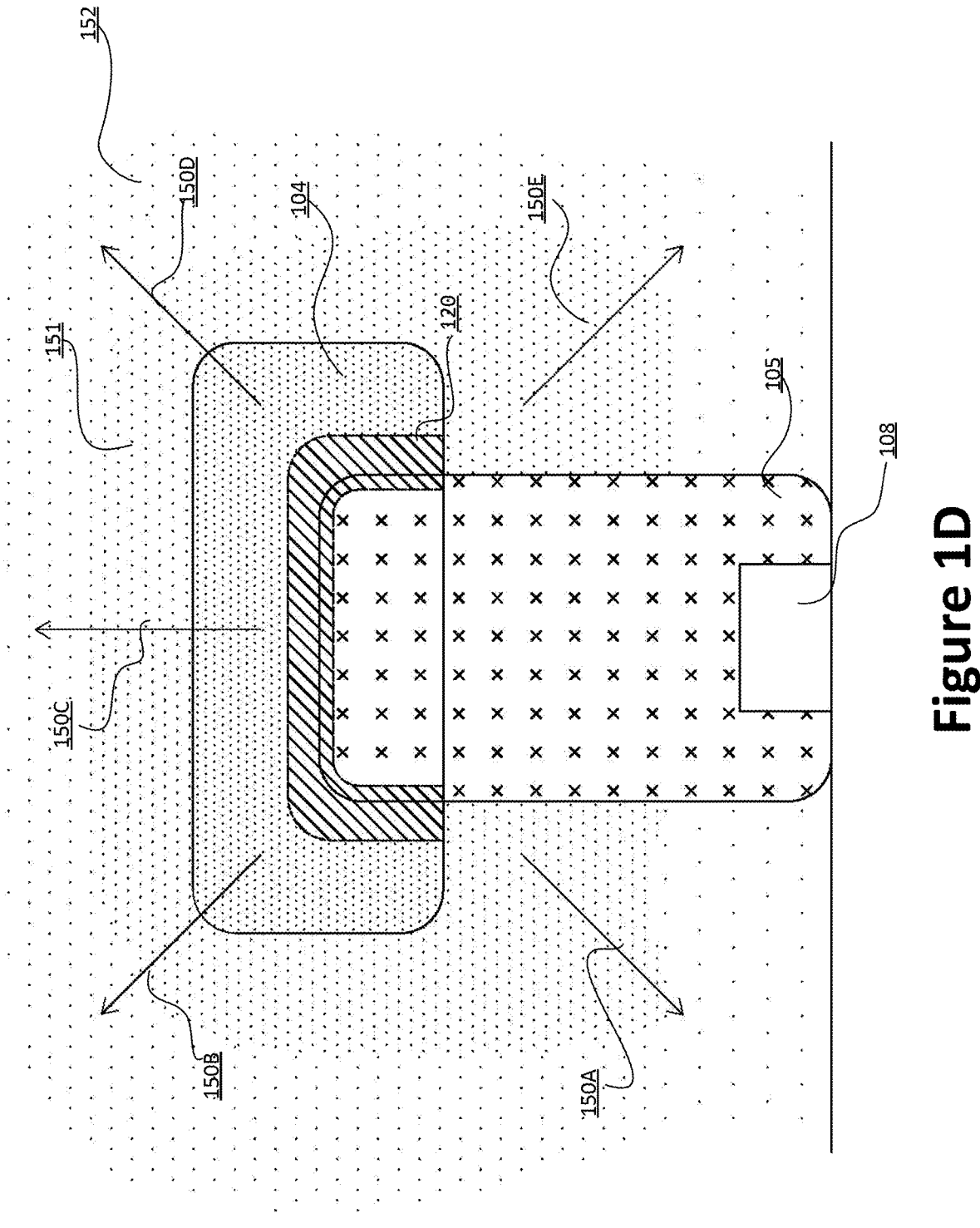
FIG. 1D is a simplified diagram illustrating exemplary doping concentrations of P-SPAD region 104 and N-SPAD region 105 according to embodiments of the present invention.

FIG. 1D is a simplified diagram illustrating exemplary doping concentrations of P-SPAD region 104 and N-SPAD region 105 according to embodiments of the present invention. This diagram is merely an example, which should not unduly limit the scope of the claims. One of ordinary skill in the art would recognize many variations, alternatives, and modifications. In various implementations, P-SPAD 104 is formed using an implantation process that creates a radial centration profile, as illustrated by arrows 150A-150E; that is, the doping concentration (of p-type material) is the greatest in the center, doping concentration is lower at region 151 than the doping concentration at the P-SPAD center, and the doping concentration is yet lower again at region 152 than the doping concentration at 151. For example, the radial concentration profile helps avalanche region 102 to capture photon-generated carriers. There are other benefits as well. It is also to be noted that N-SPAD 105 may be a rectangular cuboid (as described earlier) and thus share an interface with P-SPAD 104 that includes five (one top and four sides) junction interfaces, N-SPAD 105 may be configured in other shapes as well. For example, the top region of N-SPAD 105 that is enclosed by P-SPAD 104 may be in a substantially spherical (or rounded cone) shape that does not have clear side surfaces, but share a large junction interfere (and thus large avalanche region) with P-SPAD 104.

Figure 2A:
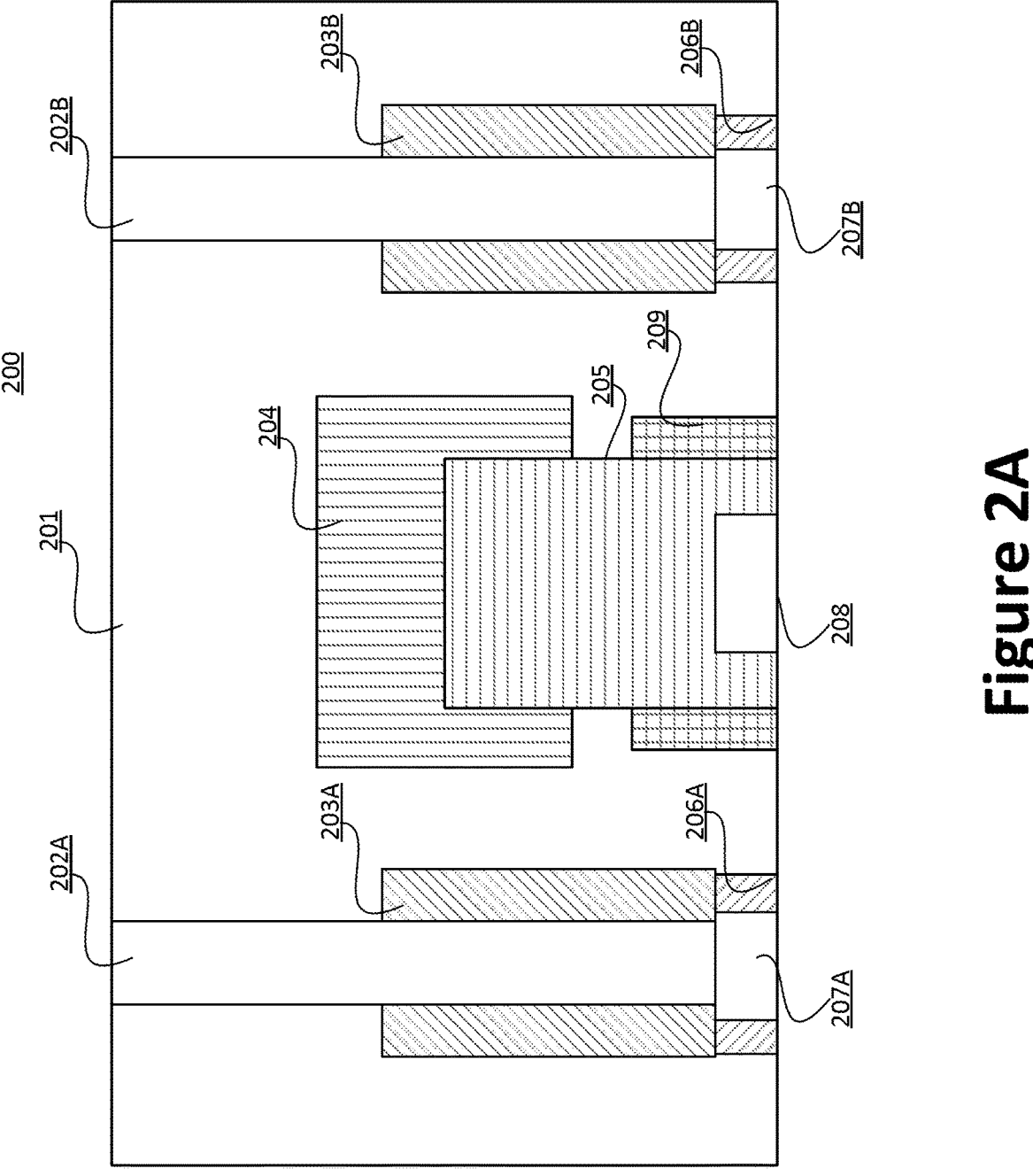
FIGS. 2A and 2B are simplified diagrams illustrating a BSI SPAD pixel device 200 with an n-well region according to embodiments of the present invention.
Figure 2B:

FIGS. 2A and 2B are simplified diagrams illustrating a BSI SPAD pixel device 200 with an n-well region according to embodiments of the present invention. These diagrams merely provide an example, which should not unduly limit the scope of the claims. One of ordinary skill in the art would recognize many variations, alternatives, and modifications. Various components are configured within silicon material 201, which may be formed by an epitaxial growth process. The boundary of device 200 is defined by isolation structures. For example, isolation structures may include DTI structures (202A and 202B) and p-well structures (203A and 203B). Device 200 are coupled to a semiconductor circuit via n contact 208 and p contacts 206A and 206B. An avalanche region within a proximity a junction between p-type material 204 ("P-SPAD") and n-type material 205 ("N-SPAD"). The junction is a three-dimension structure, which includes both a horizontal interface area and four lateral (sidewalls) interface areas. The three-dimensionality of the junction translates to a large avalanche region that is able to efficiently collect photon-generated carriers.

An n-well structure 209 is configured around the n-type material 205. For example, n-well structure 209 is characterized by a doping concentration of 1E16 to 1E18. It is to be appreciated that the n-well structure 209 can improve the performance of device 200 by reducing lateral electric field and lower the undesirable DCR.

Figure 3A:
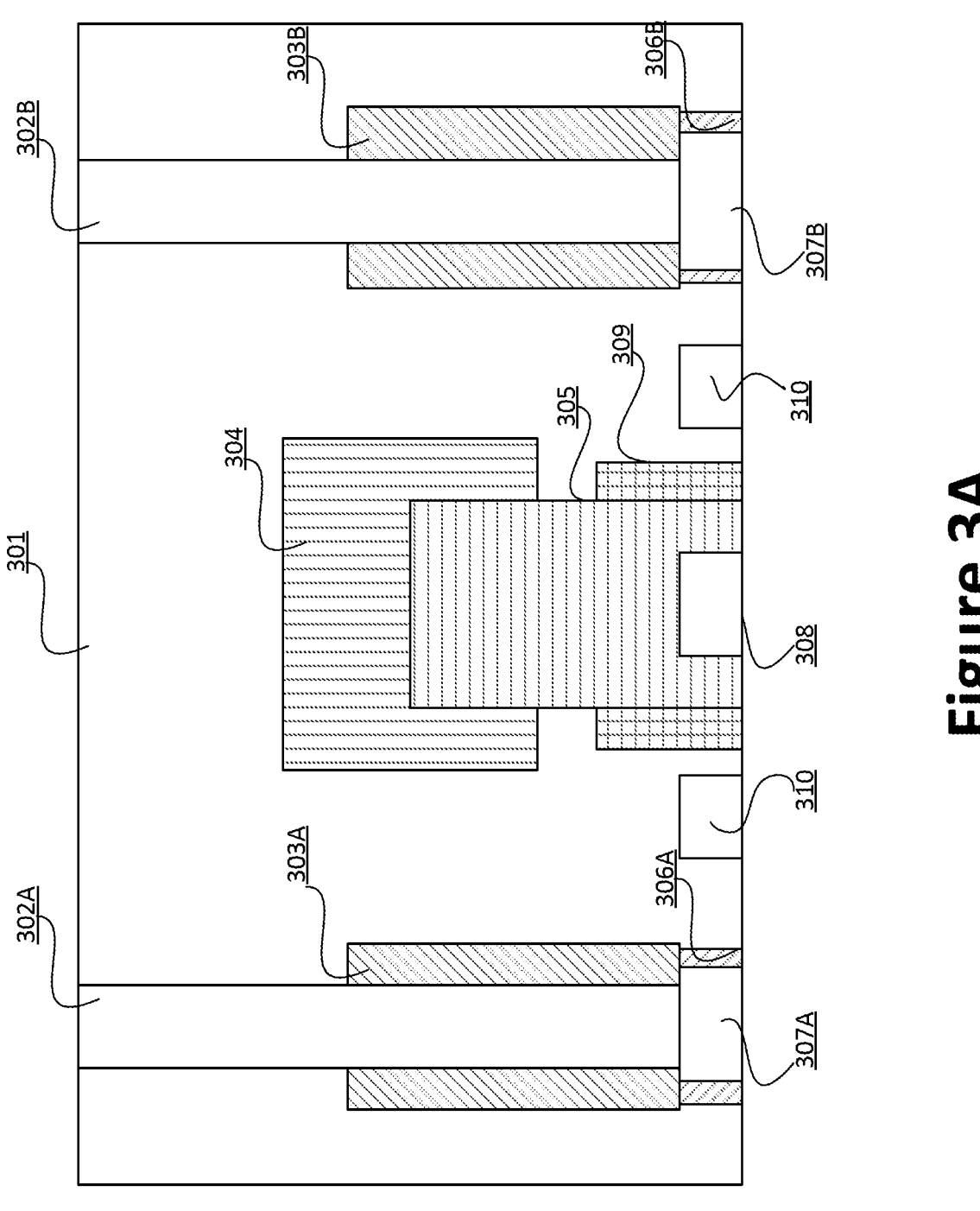
FIGS. 3A and 3B are simplified diagrams illustrating a BSI SPAD pixel device 300 with guard ring structures according to embodiments of the present invention.
Figure 3B:
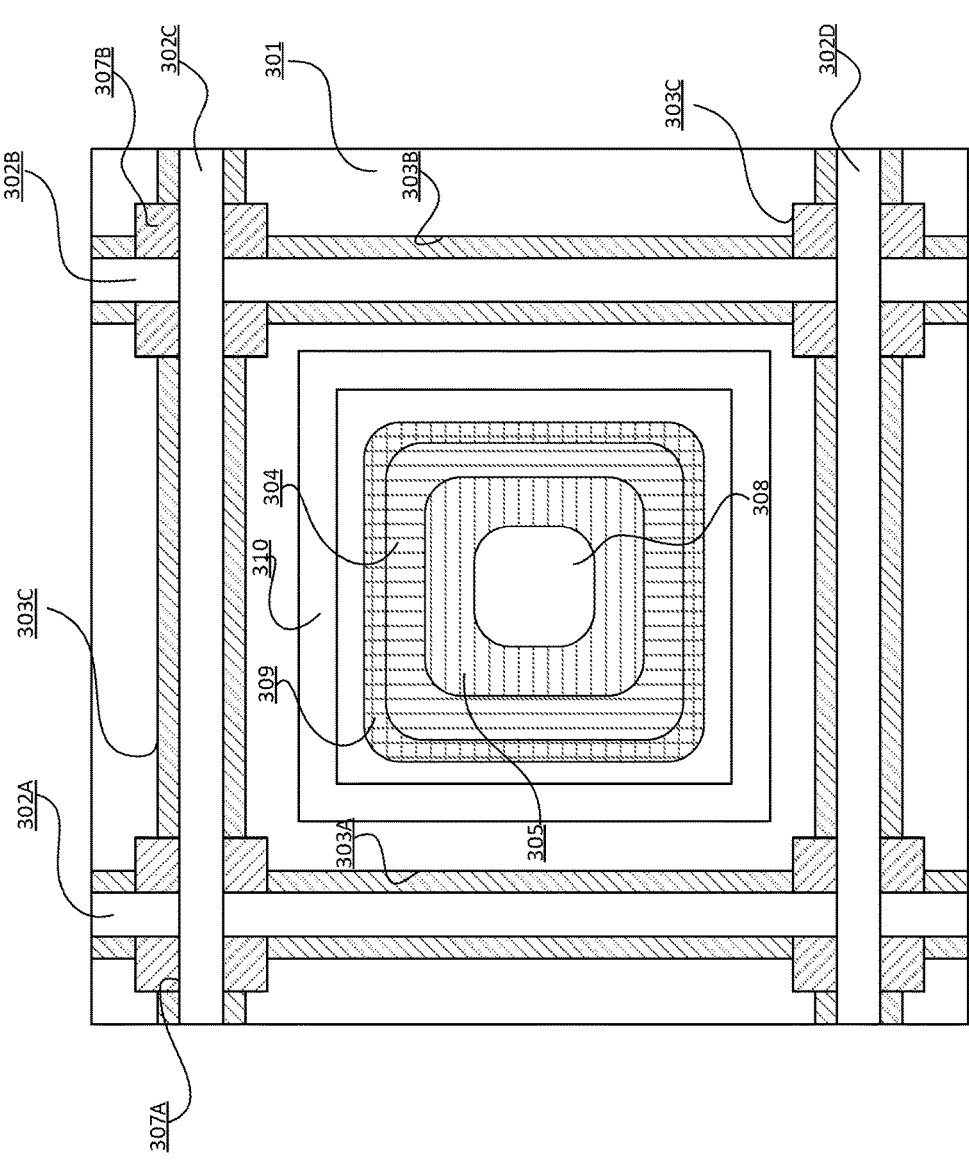

FIGS. 3A and 3B are simplified diagrams illustrating a BSI SPAD pixel device 300 with guard ring structures according to embodiments of the present invention. These diagrams merely provide an example, which should not unduly limit the scope of the claims. One of ordinary skill in the art would recognize many variations, alternatives, and modifications. Various components are configured within silicon material 301, which may be formed by an epitaxial growth process. The boundary of device 300 is defined by isolation structures. For example, isolation structures may include DTI structures (202A and 202B) and p-well structures (303A and 303B). The isolation structure may further include STI structures 307A and 307B. Device 300 are coupled to a semiconductor circuit via n contact 208 and p contacts 306A and 306B. An avalanche region within a proximity a junction between p-type material 304 ("P-SPAD") and n-type material 305 ("N-SPAD"). The junction is a three-dimension structure, which includes both a horizontal interface area and four lateral (sidewalls) interface areas. The three-dimensionality of the junction translates to a large avalanche region that is able to efficiently collect photon-generated carriers. An n-well structure 309 is configured around the n-type material 305. It is to be appreciated that the n-well structure 309 can improve the performance of device 300 by reducing lateral electric field and lower the undesirable DCR. Additionally, a guard ring structure 310 (in a square shape shown in FIG. 3B) is configured around the n-well structure 309 to reduce the undesirable path between n-type contact 308 and p-type contacts 306A and 306B. For example, the guard ring structure 310 is effective in reducing the undesirable electric field near front surface and lowering DCR.

Figure 4:
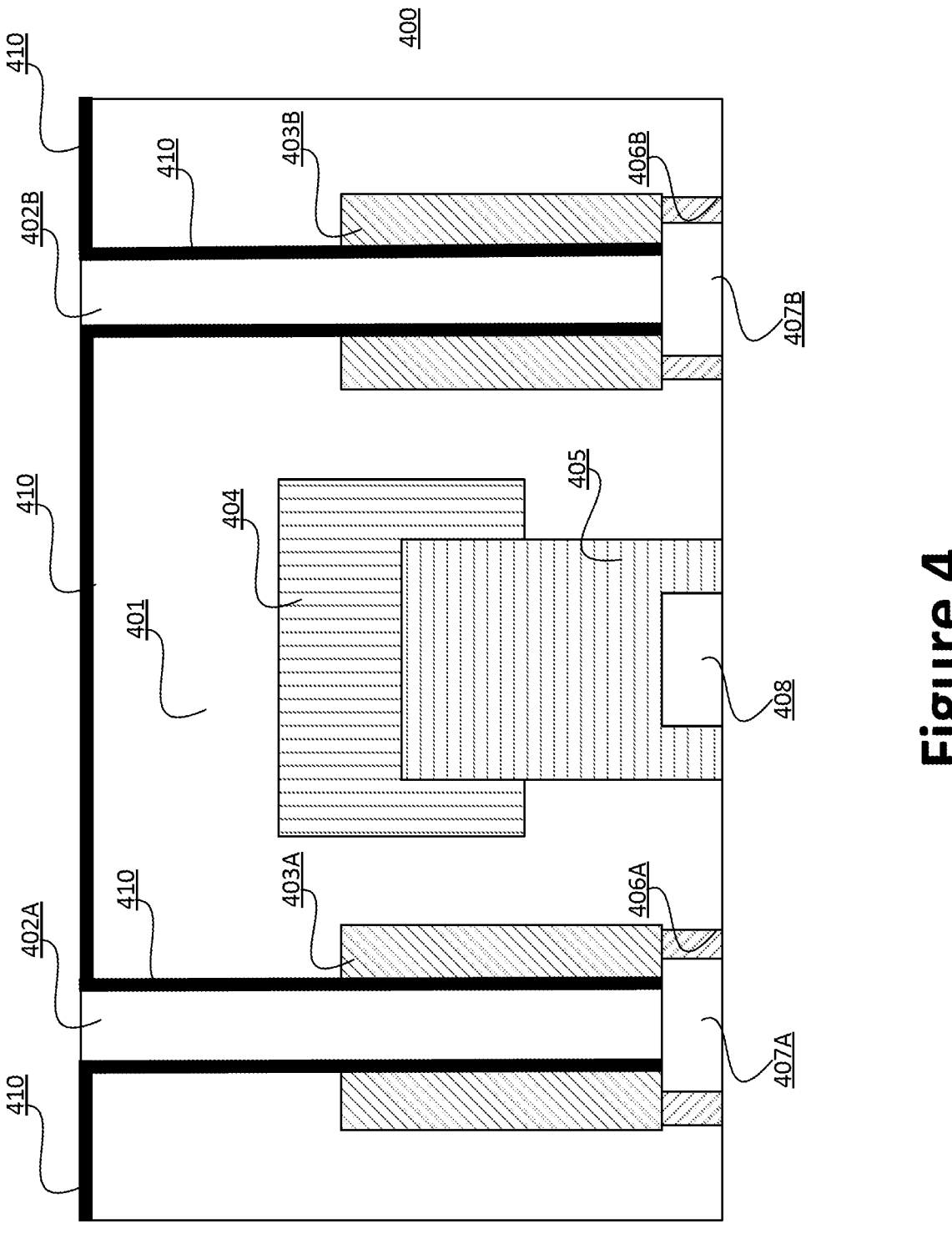
FIG. 4 is a simplified diagram illustrating a BSI SPAD pixel device 400 with a passivation layer according to embodiments of the present invention.

FIG. 4 is a simplified diagram illustrating a BSI SPAD pixel device 400 with a passivation layer according to embodiments of the present invention. This diagram is merely an example, which should not unduly limit the scope of the claims. One of ordinary skill in the art would recognize many variations, alternatives, and modifications. Various components are configured within silicon material 401, which may be formed by an epitaxial growth process. The boundary of device 400 is defined by isolation structures. For example, isolation structures may include DTI structures (402A and 402B) and p-well structures (403A and 403B). The isolation structure may further include STI structures 407A and 407B. Device 400 is coupled to a semiconductor circuit via n contact 408 and p contacts 406A and 406B. An avalanche region within a proximity a junction between p-type material 404 ("P-SPAD") and n-type material 405 ("N-SPAD"). The junction is a three-dimension structure, which includes both a horizontal interface area and four lateral (sidewalls) interface areas. The three-dimensionality of the junction translates to a large avalanche region that is able to efficiently collect photon-generated carriers. Device 400 also includes a passive layer 410. In an example, the passivation layer 410 includes an oxide material, a high-K dielectric material (e.g., Al2O3, HfO2, Ta2O5, etc.), a nitride material (Si3N4, SiON, etc), or a polyimide material, combinations thereof, and the like. For example, passive layer 410 is formed by an atomic layer deposition (ALD) process.

Figure 5:
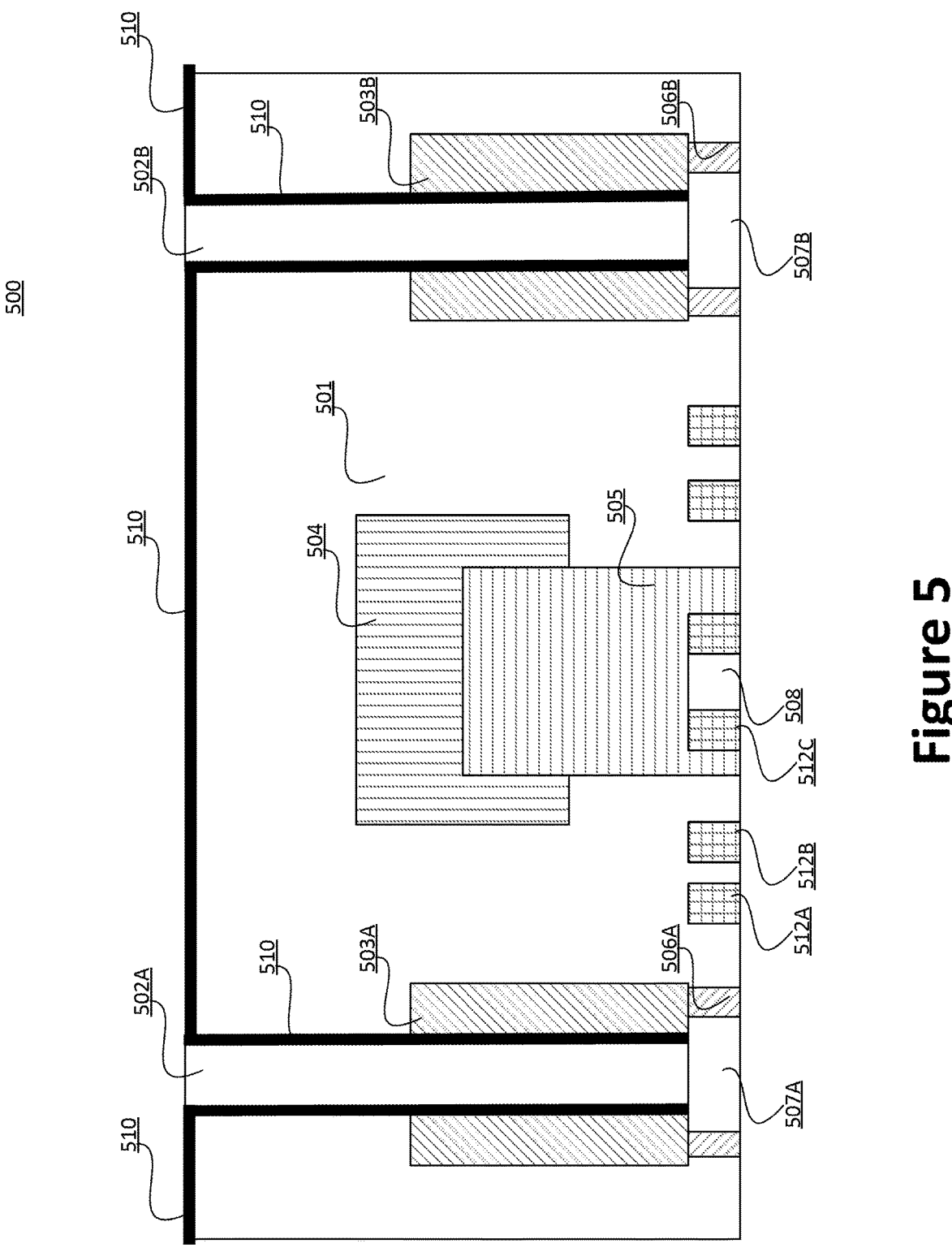
FIG. 5 is a simplified diagram illustrating a BSI SPAD pixel device 500 with light-trapping structures according to embodiments of the present invention.

FIG. 5 is a simplified diagram illustrating a BSI SPAD pixel device 500 with light-trapping structures according to embodiments of the present invention. This diagram is merely an example, which should not unduly limit the scope of the claims. One of ordinary skill in the art would recognize many variations, alternatives, and modifications. Various components are configured within silicon material 501, which may be formed by an epitaxial growth process. The boundary of device 500 is defined by isolation structures. For example, isolation structures may include DTI structures (502A and 502B) and p-well structures (503A and 503B). The isolation structure may further include STI structures 507A and 507B. Device 500 is coupled to a semiconductor circuit via n contact 508 and p contacts 506A and 506B. An avalanche region within a proximity a junction between p-type material 504 ("P-SPAD") and n-type material 505 ("N-SPAD"). The junction is a three-dimension structure, which includes both a horizontal interface area and four lateral (sidewalls) interface areas. The three-dimensionality of the junction allows for a large avalanche region that is able to efficiently collect photon-generated carriers. Device 400 also includes a passive layer 510.

Device 500 also includes light-trapping structures, at both the front side and the back side. It is to be understood that the backside light-trapping structure can be configured in other shapes as well. Device 500 also includes front side nanostructures (e.g., 512A-512C), which are configured for light trapping. In certain embodiments, device 500 also includes metal reflectors configured for the front side of device 500.

Figure 6:
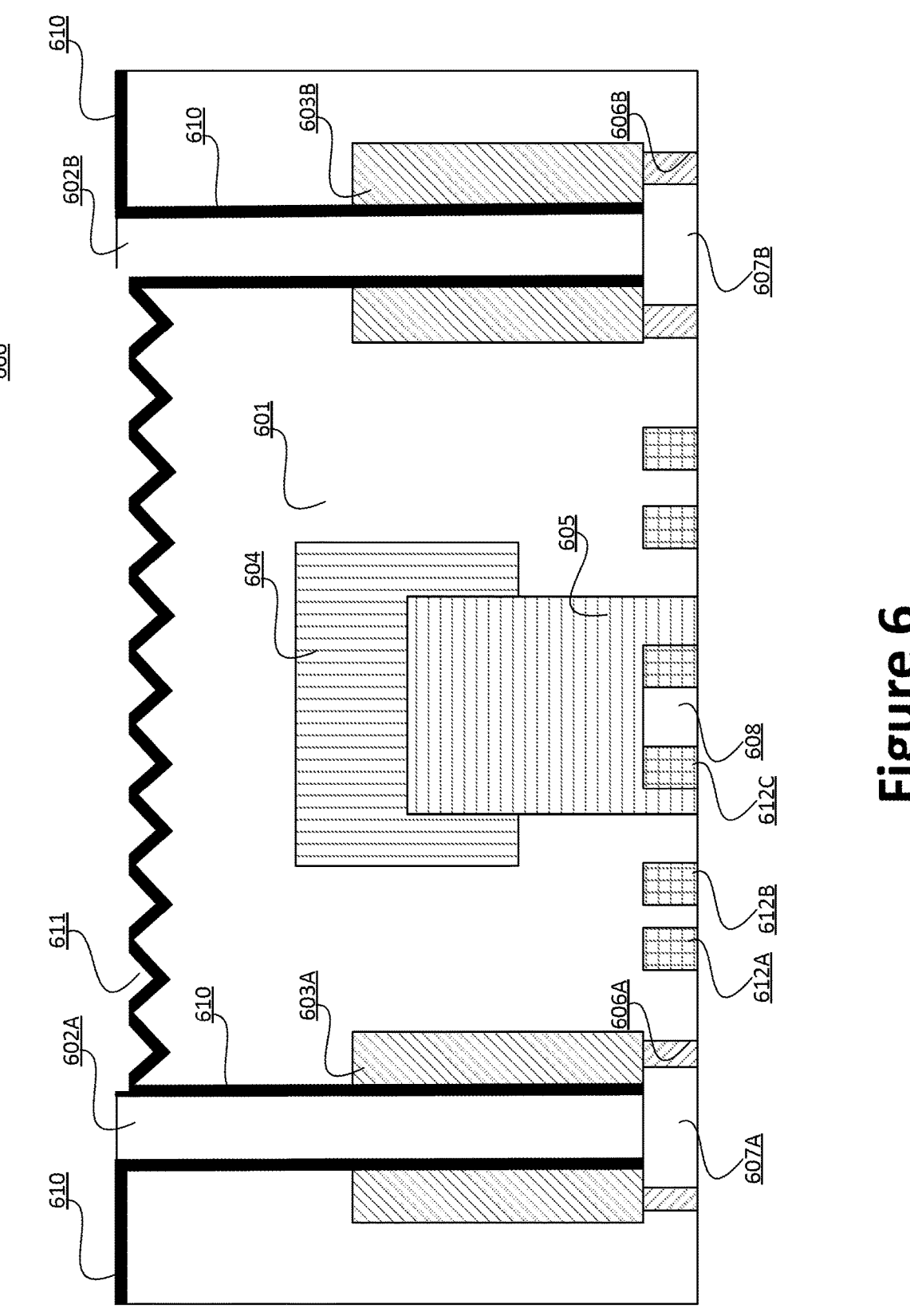
FIG. 6 is a simplified diagram illustrating a BSI SPAD pixel device 600 with light-trapping structures according to embodiments of the present invention.

FIG. 6 is a simplified diagram illustrating a BSI SPAD pixel device 600 with light-trapping structures according to embodiments of the present invention. This diagram is merely an example, which should not unduly limit the scope of the claims. One of ordinary skill in the art would recognize many variations, alternatives, and modifications. Various components are configured within silicon material 601, which may be formed by an epitaxial growth process. The boundary of device 600 is defined by isolation structures. For example, isolation structures may include DTI structures (602A and 602B) and p-well structures (603A and 603B). The isolation structure may further include STI structures 607A and 607B. Device 600 is coupled to a semiconductor circuit via n contact 608 and p contacts 606A and 606B. An avalanche region within a proximity a junction between p-type material 604 ("P-SPAD") and n-type material 605 ("N-SPAD"). The junction is a three-dimension structure, which includes both a horizontal interface area and four lateral (sidewalls) interface areas. The three-dimensionality of the junction allows for a large avalanche region that is able to efficiently collect photon-generated carriers.

Device 600 also includes light-trapping structures, at both the front side and the back side. For example, a backside light-trapping structure 611 overlays the aperture of device 600 and it is characterized by a seesaw shape. The backside light-trapping structure 611 can be configured in other shapes as well. Device 600 also includes front side nanostructures (e.g., 612A-612C), which are configured for light trapping. Device 600 also includes a passive layer 610

Figure 7:
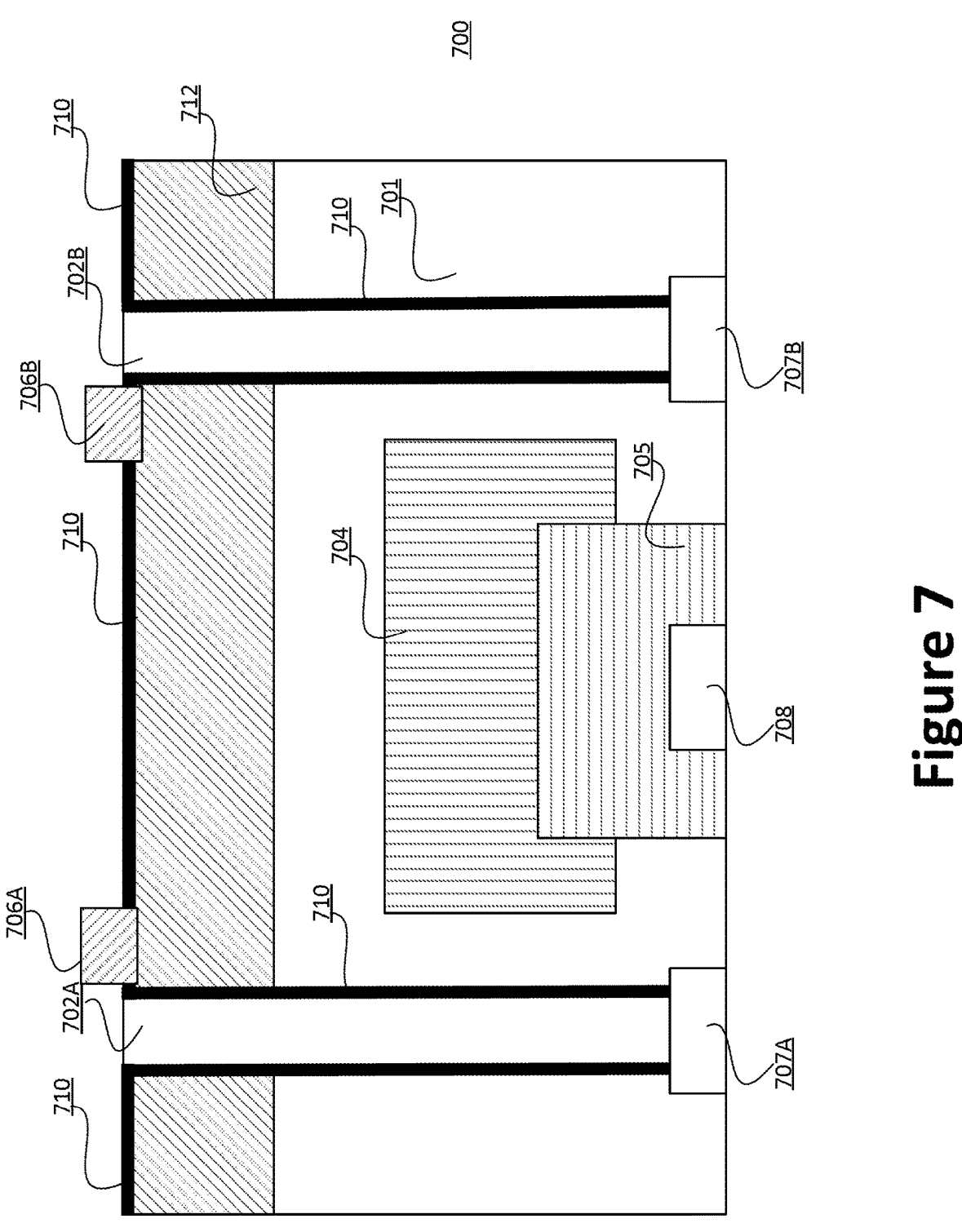
FIG. 7 is a simplified diagram illustrating a BSI SPAD pixel device 700 with backside contacts according to embodiments of the present invention.

FIG. 7 is a simplified diagram illustrating a BSI SPAD pixel device 700 with back side contacts according to embodiments of the present invention. This diagram is merely an example, which should not unduly limit the scope of the claims. One of ordinary skill in the art would recognize many variations, alternatives, and modifications. Various components are configured within silicon material 701, which may be formed by an epitaxial growth process. The boundary of device 700 is defined by isolation structures. For example, isolation structures may include DTI structures (702A and 702B). The device also includes STI structures 707A and 707B. Device 700 is coupled to a semiconductor circuit via n contact 708 and p contacts 706A and 706B. An avalanche region within a proximity a junction between p-type material 704 ("P-SPAD") and n-type material 705 ("N-SPAD"). The junction is a three-dimension structure, which includes both a horizontal interface area and four lateral (sidewalls) interface areas. The three-dimensionality of the junction translates to a large avalanche region that is able to efficiently collect photon-generated carriers. Device 700 also includes a passive layer 710

A p-type region 712 is configured near the back side of device 700. It is to be noted that p contacts 706A and 706B are configured on the backside of device 700. With p contacts positioned far away from the n contact 708 and n-type material 705, the width of N-SPAD 705 can be greater (e.g., compared to N-SPAD 805), which may translate to a bigger junction area and larger avalanche region. Device 700 also includes a passive layer 710. In example, the passivation layer 710 includes an oxide material, a high-K dielectric material (e.g., Al2O3, HfO2, Ta2O5, etc.), a nitride material (Si3N4, SiON, etc), or a polyimide material, combinations thereof, and the like.

Figure 8:
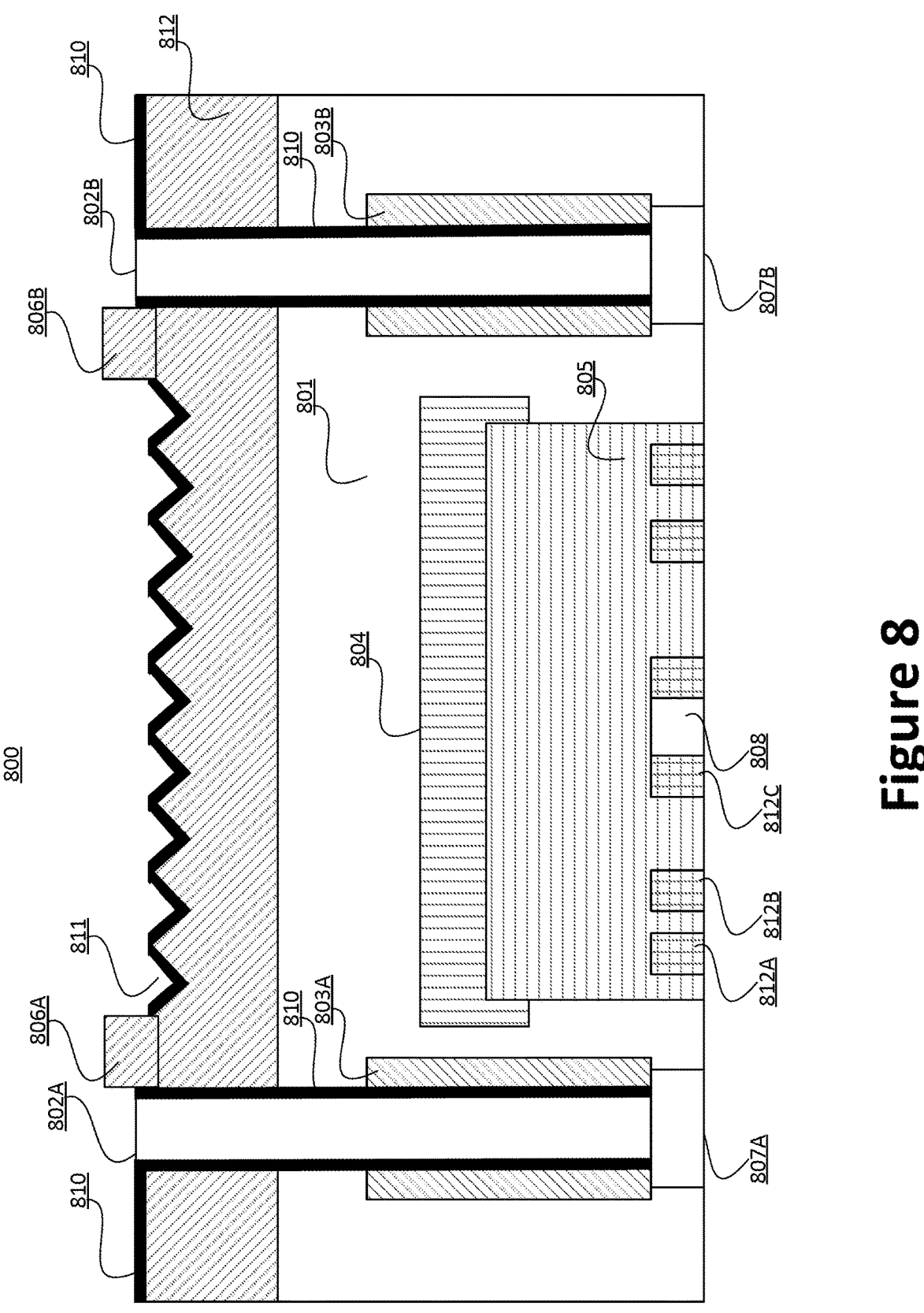
FIG. 8 is a simplified diagram illustrating a BSI SPAD pixel device 800 with backside contacts and light-trapping structures according to embodiments of the present invention.

FIG. 8 is a simplified diagram illustrating a BSI SPAD pixel device 800 with back side contacts and light-trapping structures according to embodiments of the present invention. This diagram is merely an example, which should not unduly limit the scope of the claims. One of ordinary skill in the art would recognize many variations, alternatives, and modifications. Various components are configured within silicon material 801, which may be formed by an epitaxial growth process. The boundary of device 800 is defined by isolation structures. For example, isolation structures may include DTI structures (802A and 802B). The device also includes STI structures 707A and 707B. Device 800 is coupled to a semiconductor circuit via n contact 808 and p contacts 806A and 806B. An avalanche region within a proximity a junction between p-type material 804 ("P-SPAD") and n-type material 805 ("N-SPAD"). The junction is a three-dimension structure, which includes both a horizontal interface area and four lateral (sidewalls) interface areas. The three-dimensionality of the junction translates to a large avalanche region that is able to efficiently collect photon-generated carriers.

A p-type region 812, which may be implanted, is configured near the back side of device 800. The p contacts 806A and 806B are configured on the backside of device 700. With p contacts positioned far away from the n contact 808 and n-type material 805, the width of N-SPAD 805 can be greater (e.g., compared to N-SPAD 805), which may translate to a bigger junction area and larger avalanche region. Device 800 also includes a passive layer 810. In an example, the passivation layer 810 includes an oxide material, a high-K dielectric material (e.g., Al2O3, HfO2, Ta2O5, etc.), a nitride material (Si3N4, SiON, etc), or a polyimide material, combinations thereof, and the like. Device 800 also includes light-trapping structures, at both the front side and the back side. For example, a backside light-trapping structure 811 overlays the aperture of device 800 and it is characterized by a seesaw shape. The backside light-trapping structure 811 can be configured in other shapes as well. Device 800 also includes front side nanostructures (e.g., 812A-812C), which are configured for light trapping. Device 800 also includes a passive layer 810.

Figure 9:
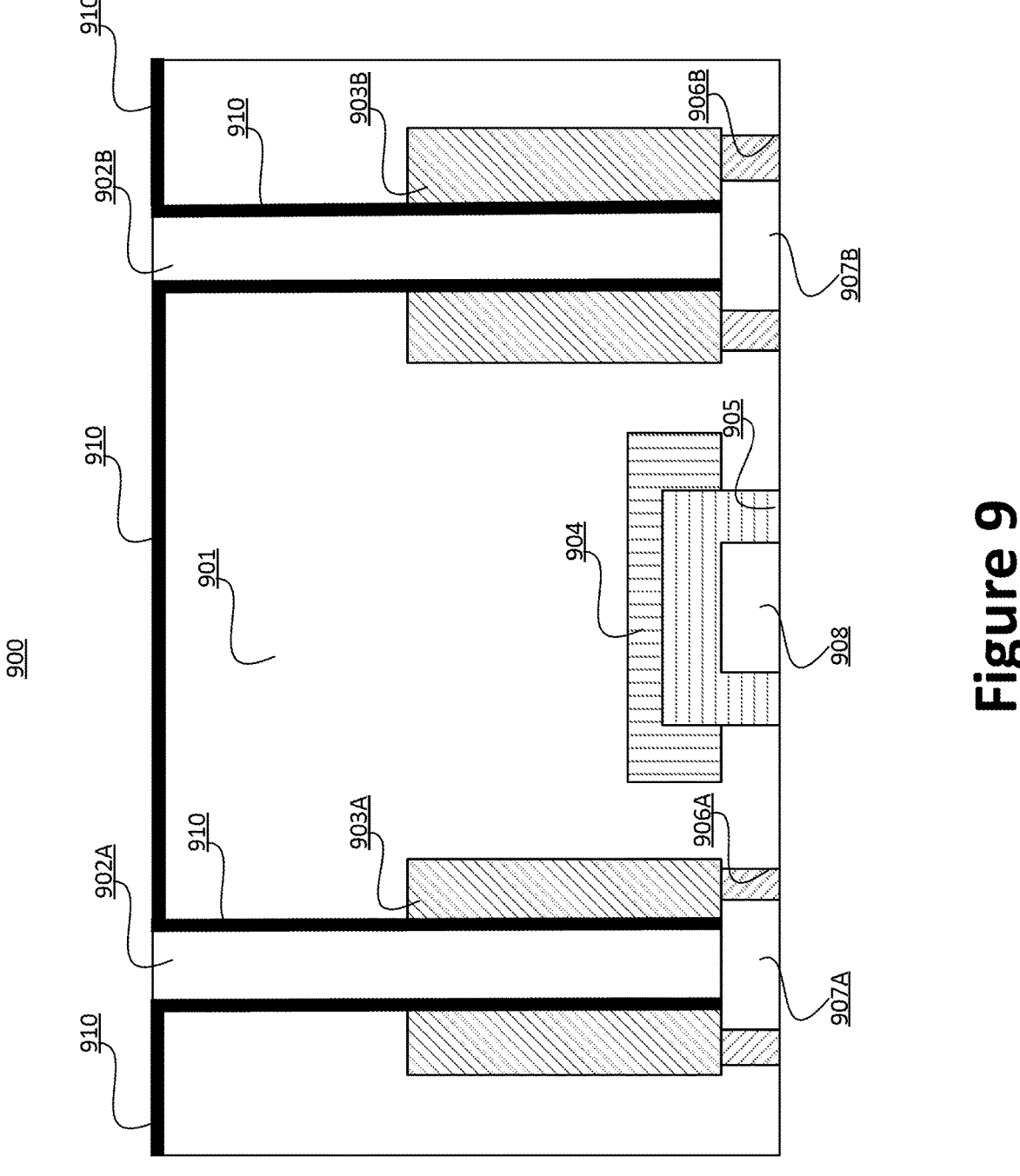
FIG. 9 is a simplified diagram illustrating a BSI SPAD pixel device 900 shallow SPAD regions according to embodiments of the present invention.

FIG. 9 is a simplified diagram illustrating a BSI SPAD pixel device 900 shallow SPAD regions according to embodiments of the present invention. This diagram is merely an example, which should not unduly limit the scope of the claims. One of ordinary skill in the art would recognize many variations, alternatives, and modifications. Various components are configured within silicon material 901, which may be formed by an epitaxial growth process. The boundary of device 900 is defined by isolation structures. For example, isolation structures may include DTI structures (902A and 902B) and p-well structures (903A and 903B). Device 900 is coupled to a semiconductor circuit via n contact 908 and p contacts 907A and 907B. An avalanche region within a proximity a junction between p-type material 904 ("P-SPAD") and n-type material 905 ("N-SPAD"). As can be seen in FIG. 9, P-SPAD 904 and N-SPAD 905 are characterized by a low-profile (e.g., compared to P-SPAD 904 and N-SPAD 905). The junction is a three-dimension structure, which includes both a horizontal interface area and four lateral (sidewalls) interface areas. The three-dimensionality of the junction translates to a large avalanche region that is able to efficiently collect photon-generated carriers. Device 900 also includes a passive layer 910. In an example, the passivation layer 910 includes an oxide material, a high-K dielectric material (e.g., Al2O3, HfO$_2$, Ta$_2$O$_5$, etc.), a nitride material (Si$_3$N$_4$, SiON, etc.), or a polyimide material, combinations thereof, and the like. For example, passive layer 910 is formed by an atomic layer deposition (ALD) process. Device 900 also includes a passive layer 910.

Figure 10:
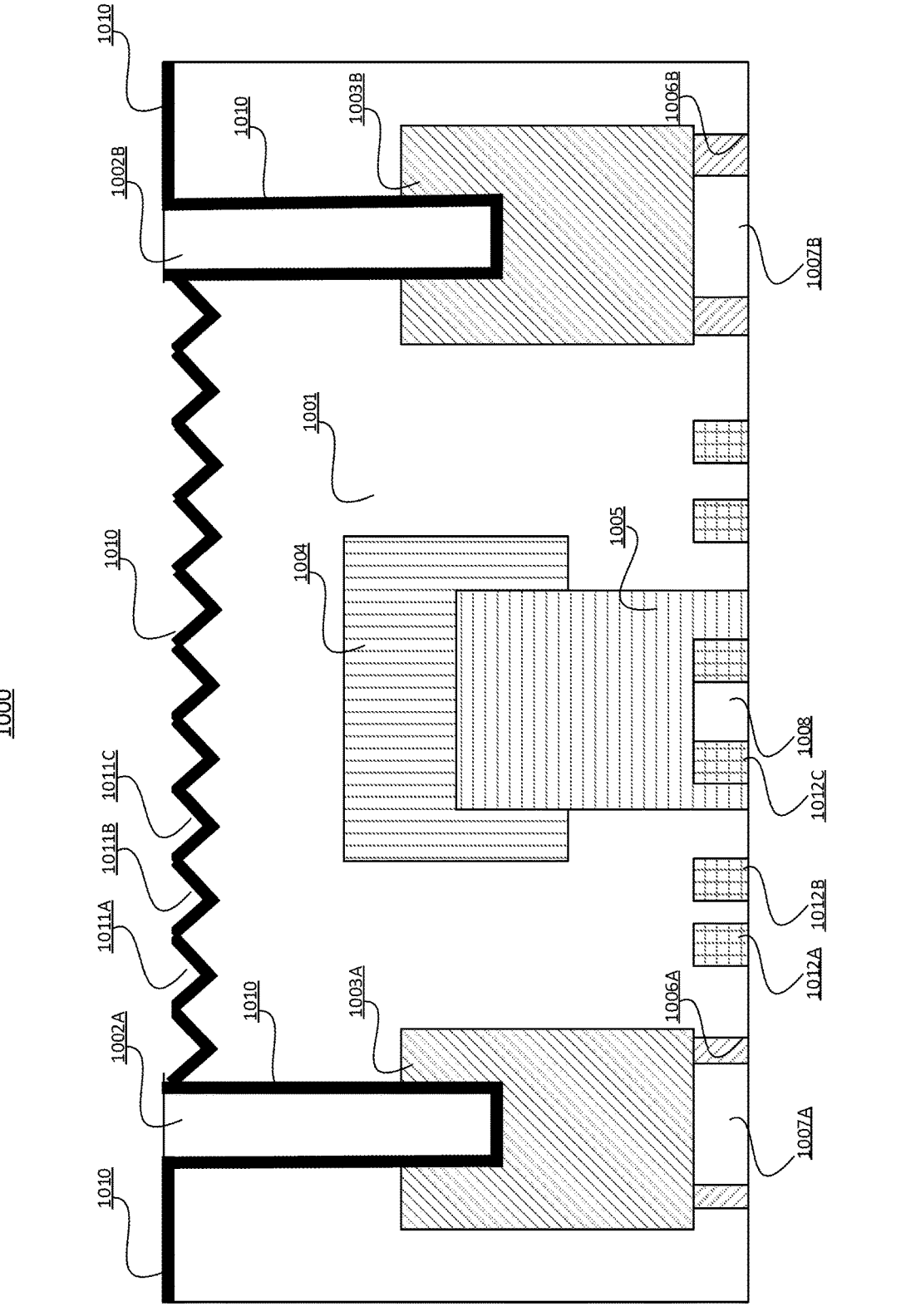
FIG. 10 is a simplified diagram illustrating a BSI SPAD pixel device 1000 with partial deep trench structures according to embodiments of the present invention.

FIG. 10 is a simplified diagram illustrating a BSI SPAD pixel device 1000 with partial deep trench structures according to embodiments of the present invention. This diagram is merely an example, which should not unduly limit the scope of the claims. One of ordinary skill in the art would recognize many variations, alternatives, and modifications. Various components are configured within silicon material 1001, which may be formed by an epitaxial growth process. The boundary of device 1000 is defined by isolation structures. For example, isolation structures may include DTI structures (1002A and 1002B) and p-well structures (1003A and 1003B). For example, DTI structures 1002A and 1002B are formed from the backside of device 1000, and they do not reach all the way down to the front side: they interface with respective p-well structures 1003A and 1004B. Device 1000 is coupled to a semiconductor circuit via n contact 1008 and p contacts 1007A and 1007B. An avalanche region within a proximity a junction between p-type material 1004 ("P-SPAD") and n-type material 1005 ("N-SPAD"). The junction is a three-dimension structure, which includes both a horizontal interface area and four lateral (sidewalls) interface areas. The three-dimensionality of the junction allows for a large avalanche region that is able to efficiently collect photon-generated carriers.

Device 1000 also includes light-trapping structures, at both the front side and the back side. For example, a backside light-trapping structure overlays the aperture of device 1000 and includes nanostructures 1011A-C as shown. In various embodiments, nanostructures 1011A-C keep photons inside the pixel device and increases the chance that these photons would collect. It is to be understood that the backside light-trapping structure can be configured in other shapes as well. Device 1000 also includes front side nanostructures (e.g., 1012A-1012C), which are configured for light trapping. Device 1000 also includes a passive layer 1010.

Figure 11:
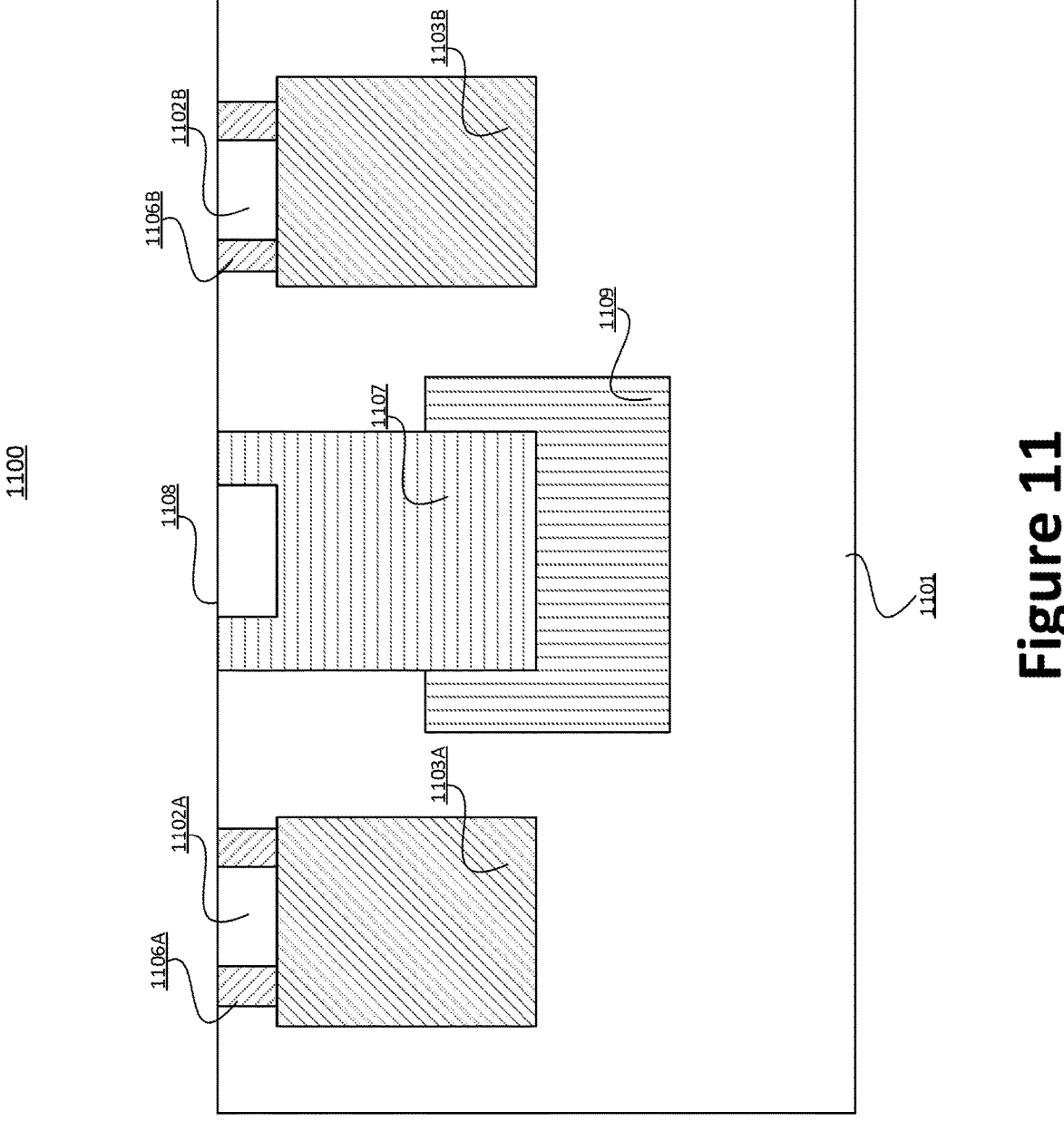
FIG. 11 is a simplified diagram illustrating an FSI SPAD pixel device 1100 according to embodiments of the present invention.

FIG. 11 is a simplified diagram illustrating an FSI SPAD pixel device 1100 according to embodiments of the present invention. This diagram is merely an example, which should not unduly limit the scope of the claims. One of ordinary skill in the art would recognize many variations, alternatives, and modifications. As explained above, the term "front size" refers to the front or top side of a semiconductor wafer during the manufacturing process, and the front side is at the bottom of device 1100 in FIG. 11. The FSI configuration of device 1100 means that the aperture (where photons enter device 1100) is at the front side (bottom of device 1100 in FIG. 11). In various embodiment, the boundary of device 1100 is defined by isolation structures. For example, isolation structures include DTI structures (1103A and 1103B) as shown. For example, isolation structures may also include STI structures (1102A and 1102B) as shown. For example, DTI structures 1102A and 1102B are formed from the front of device 1100, and they do not reach all the way through the epi layer. Device 1100 is coupled to a semiconductor circuit via n contact 1108 and p contacts 1106A and 1170B. An avalanche region within a proximity a junction between p-type material 1109 ("P-SPAD") and n-type material 1007 ("N-SPAD"). The junction is a three-dimension structure, which includes both a horizontal interface area and four lateral (sidewalls) interface areas. The three-dimensionality of the junction allows for a large avalanche region that is able to efficiently collect photon-generated carriers.

Figure 12:
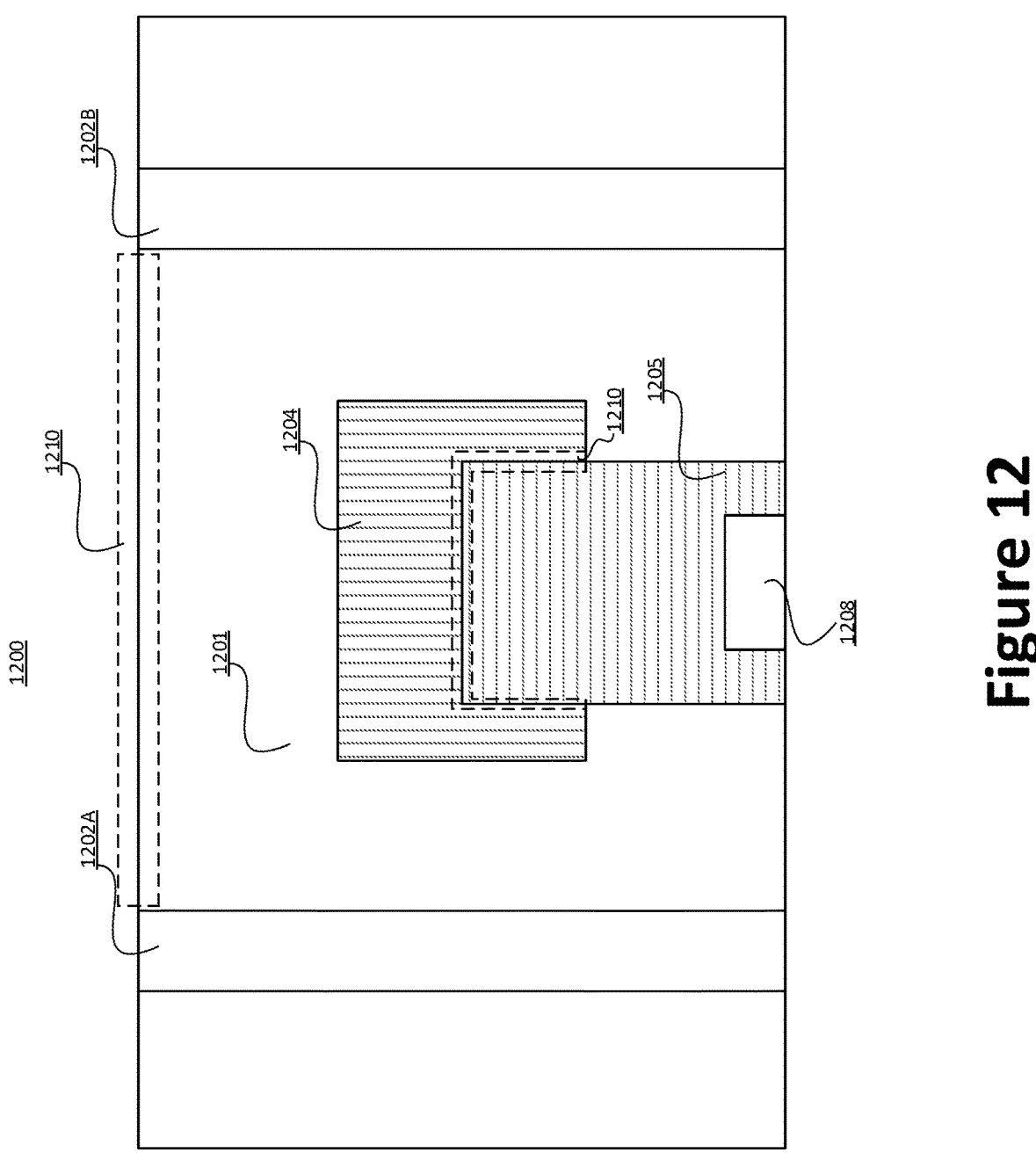
FIG. 12 is a simplified diagram illustrating a SPAD pixel device 1200 according to embodiments of the present invention.

FIG. 12 is a simplified diagram illustrating a SPAD pixel device 1200 according to embodiments of the present invention. This diagram is merely an example, which should not unduly limit the scope of the claims. One of ordinary skill in the art would recognize many variations, alternatives, and modifications. Device 1200 includes, among other structures, a silicon material 1201. For example, silicon material 1201 may be formed by an epitaxial growth process. Device 1200 is separate from other SPAD pixel devices (not shown here) by isolation structures 1202A and 1202B. Depending on the implementation, isolation structures may include DTI, STI, p-well, and/or other structures. An aperture region 1210 is configured at the surface and between the isolation structures. For example, various optical structures or isolation layers may be configured at aperture region 1210. An n-type material region (or "N-SPAD") region 1204 as shown is configured alongside a p-type material region (or "P-SPAD") region 1205. For example, N-SPAD 1204 and P-SPAD 1205 may be formed by implantation or other processes. Avalanche region 1210 is formed near the junction between the N-SPAD 1204 and P-SPAD 1205. A p-type contact 1208 is configured at a location near the P-SPAD 1205 as shown. As shown in FIG. 12, N-SPAD 1204 is characterized by a volume whose bottom region enclosing a portion of the P-SPAD 1205—with the bottom region of N-SPAD 1204 bigger than the top region of N-SPAD 1205. The three-dimensionality of the avalanche region allows for improved carrier capturing compared to existing SPAD designs, as explained above. It is to be appreciated that instead of P-SPAD partially enclosing N-SPAD—as illustrated in FIGS. 1-11—device 1200 has N-SPAD partially enclosing P-SPAD. Variations of device 1200 may include other structures and arrangements thereof, such as different isolation and contact configurations, as well as optical structures (passivation layers, optical elements, reflectors, etc.).

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A backside illuminated (BSI) single-photon avalanche diode (SPAD) sensor device comprising:

a silicon material having a front side and a back side; a first deep trench structure positioned within the silicon material;

a second deep trench structure positioned within the silicon material;

an aperture positioned on the back side and between the first deep trench structure and the second deep trench structure;

an n-type material having a first top region and a first bottom region, the first bottom region bordering the back side, the first top region comprising a top surface and a first sidewall and a second sidewall, the first sidewall and the second sidewall being positioned laterally relative to the top surface, the n-type material being characterized by a first width;

an n-type contact directly coupled to the n-type material and positioned within the first bottom region;

a p-type material having a second top region and a second bottom region, the second bottom region enclosing the first top surface and the first sidewall and the second sidewall, a top surface of the p-type material and a first sidewall of the p-type material being continuous, the p-type material being characterized by a second width, the second width being greater than the first width, a top surface of the p-type material directly interfacing the silicon material, a side surface of the p-type material directly interfacing the silicon material; and a junction region configured at an interface between the first top region and the second bottom region, the junction region comprises an avalanche area for collecting photon-generated carriers, the junction region comprising an overlap region positioned between the first sidewall of the n-type material and the first sidewall of the p-type material;

wherein the p-type material is characterized by a concentration gradient that a concentration of p-type material decreases from a horizontal interface and lateral sidewall interfaces of the junction region toward the backside, the concentration gradient comprising a retrograde profile and being associated by a post-implantation anneal process, the concentration gradient being associated with multiple energies in implantation, the p-type material comprising a boron material having a concentration density of 1 E15 atoms/cm3 to 1 E18 atoms/cm3, the retrograde profiles creating a higher electric field to shorten a carrier travel time from the silicon material to the avalanche area and reduce jitter, the retrograde profile being offset from the front side to position the avalanche area away from the front side to prevent carriers generated by front-surface defects from reaching the avalanche area.

2. The device of claim 1 further comprising a first shallow trench structure interfacing the first deep trench structure and a second shallow trench structure interfacing the second deep trench structure.

3. The device of claim 2 further comprising a first p-type contact interfacing the first shallow trench structure and a second p-type contact interfacing the second shallow trench structure.

4. The device of claim 2 further comprising:

a first p-type contact configured within a vicinity of the first shallow trench structure and the front side; and a second p-type contact configured within a vicinity of the second shallow trench structure and the front side.

5. The device of claim 1 further comprising a P+ region positioned within a vicinity of the front side.

6. The device of claim 1 further comprising a plurality of light trapping structures configured within a vicinity of the back side.

7. The device of claim 1 further comprising a plurality of light trapping structures configured within a vicinity of the front side.

8. The device of claim 1 wherein the junction region comprises an avalanche region.

9. The device of claim 1 further comprising a first P-well structure partially enclosing the first deep trench structure and a second P-well structure partially enclosing the second deep trench structure.

10. The device of claim 1 wherein the silicon material comprises an epitaxially grown silicon material.

11. The device of claim 1 further comprising a passivate layer overlaying the aperture.

12. The device of claim 1 wherein the p-type material is characterized by a graduated doping profile.

13. The device of claim 1 further comprising an N-well region partially overlaying the first bottom region of the n-type material.

14. A single-photon avalanche diode (SPAD) sensor device comprising:

a silicon material having a front side and a back side;

a first isolation structure positioned within the silicon material and bordering the back side;

a second isolation structure positioned within the silicon material and bordering the back side;

an n-type material having a first top region and a first bottom region, the first bottom region bordering the back side, the first top region comprising a top surface and a first sidewall and a second sidewall, the first sidewall and the second sidewall being positioned laterally relative to the top surface, the n-type material being characterized by a first width;

an n-type contact directly coupled to the n-type material and positioned within the first bottom region;

a p-type material having a second top region and a second bottom region, the p-type material being characterized by a radial concentration profile having a greatest doping concentration at a center of the p-type material, the second bottom region enclosing the first top surface and the first sidewall and the second sidewall, a top surface of the p-type material and a first sidewall of the p-type material being continuous, the p-type material being characterized by a second width, the second width being greater than the first width, a top surface of the p-type material directly interfacing the silicon material, a side surface of the p-type material directly interfacing the silicon material; and a junction region configured at an interface between the first top region and the second bottom region, the junction region comprising an overlap region positioned between the first sidewall of the n-type material and the first sidewall of the p-type material;

wherein the p-type material is characterized by a concentration gradient that a concentration of p-type material decreases from a horizontal interface and lateral sidewall interfaces of the junction region toward the backside, the concentration gradient comprising a retrograde profile and being associated by a post-implantation anneal process, the concentration gradient being associated with multiple energies in implantation, the p-type material comprising a boron material having a concentration density of 1 E15 atoms/cm3 to 1 E18 atoms/cm3, the retrograde profiles creating a higher electric field to shorten a carrier travel time from the silicon material to the avalanche area and reduce jitter, the retrograde profile being offset from the front side to position the avalanche area away from the front side to prevent carriers generated by front-surface defects from reaching the avalanche area.

15. The device of claim 14 further comprising an aperture positioned on the back side and between the first isolation structure and the second isolation structure.

16. The device of claim 15 further comprising a passivation layer overlaying the aperture and the first isolation structure.

17. The device of claim 14 wherein:

the first isolation structure comprises a first deep trench structure and a first p-well structure, the first p-well structure partially enclosing the first deep trench structure; and the second isolation structure comprises a second deep trench structure and a second p-well structure, the second p-well structure partially enclosing the second deep trench structure.

18. The device of claim 17 further comprising a first shallow trench structure interfacing the first p-well structure and a second shallow trench structure interfacing the second p-well structure.

19. A frontside illuminated (FSI) single-photon avalanche diode (SPAD) sensor device comprising:

a silicon material having a front side and a back side;

a first isolation structure positioned within the silicon material;

a second isolation structure positioned within the silicon material;

an aperture positioned on the front side and configured between the first isolation structure and the second isolation structure;

an n-type material having a first top region and a first bottom region, the first top region bordering the back side, the first bottom region comprising a bottom surface and a first sidewall and a second sidewall, the first sidewall and the second sidewall being positioned laterally relative to the bottom surface, the n-type material being characterized by a first width;

an n-type contact directly coupled to the n-type material and positioned within the first top region;

a p-type material having a second top region and a second bottom region, the second top region completely enclosing the first bottom surface and partially enclosing the first sidewall and the second sidewall, the bottom surface and the first sidewall of the p-type material being continuous, the p-type material being characterized by a second width, the second width being greater than the first width, the second top region is characterized by a first doping concentration, the second bottom region is characterized by a second doping concentration, the first doping concentration being lower than the second doping concentration; and an active junction region configured at an interface between the first bottom region and the second top region, the active junction region comprising an overlap region positioned between the first sidewall of the n-type material and the first sidewall of the p-type material;

wherein the p-type material is characterized by a concentration gradient that a concentration of p-type material decreases from near the junction region toward the backside, the concentration gradient comprising a retrograde profile and being associated by a post-implantation anneal process, the concentration gradient being associated with multiple energies in implantation, the p-type material comprising a boron material having a concentration density of 1E15 atoms/cm3 to 1E18 atoms/cm3, the retrograde profiles creating a higher electric field to shorten a carrier travel time from the silicon material to the avalanche area and reduce jitter, the retrograde profile being offset from the front side to position the avalanche area away from the front side to prevent carriers generated by front-surface defects from reaching the avalanche area.

20. The device of claim 19 wherein the first isolation structure comprises a p-well region.

* * * * *